US011774469B2

(12) United States Patent
Liberty

(10) Patent No.: US 11,774,469 B2
(45) Date of Patent: Oct. 3, 2023

(54) AUTO RANGING AMMETER WITH ACCURATE MEASUREMENT DURING RANGE CHANGES

(71) Applicant: Jetperch LLC, Olney, MD (US)

(72) Inventor: Matthew Girard Liberty, Olney, MD (US)

(73) Assignee: JETPERCH LLC, Olney, MD (US)

( * ) Notice: Subject to any disclaimer, the term of this patent is extended or adjusted under 35 U.S.C. 154(b) by 0 days.

(21) Appl. No.: 17/662,168

(22) Filed: May 5, 2022

(65) Prior Publication Data
US 2022/0365117 A1  Nov. 17, 2022

Related U.S. Application Data

(60) Provisional application No. 63/185,200, filed on May 6, 2021.

(51) Int. Cl.
G01R 19/25 (2006.01)

(52) U.S. Cl.
CPC .................... G01R 19/25 (2013.01)

(58) Field of Classification Search
CPC .... G01R 15/09; G01R 19/25; G01R 19/2506; G01R 19/0023; G01R 19/0038; G01R 19/257; G01R 19/16519; G02F 1/13334; H01J 17/485; H01J 2217/49207
See application file for complete search history.

(56) References Cited

U.S. PATENT DOCUMENTS

| | | | |
|---|---|---|---|
| 2,905,899 A | 9/1959 | Miller et al. | |
| 3,958,178 A * | 5/1976 | Mueller | G01R 15/09 324/99 D |
| 3,976,941 A | 8/1976 | Milkovic | |
| 4,096,434 A | 6/1978 | Meyer | |
| 4,271,392 A | 6/1981 | Outram et al. | |
| 5,250,893 A * | 10/1993 | Gambill | G01R 15/09 324/99 D |
| 5,319,305 A * | 6/1994 | Baba | G01R 15/09 324/115 |
| 5,920,189 A * | 7/1999 | Fisher | G01R 15/09 324/130 |
| 6,380,726 B1 * | 4/2002 | Szabo | G01R 15/09 324/121 R |
| 6,397,155 B1 * | 5/2002 | Przydatek | G01R 22/00 702/65 |
| 6,603,301 B2 | 8/2003 | Benes | |
| 7,242,177 B2 | 7/2007 | Maier et al. | |
| 7,352,245 B2 * | 4/2008 | Shih | G05F 3/262 330/288 |
| 7,358,716 B2 | 4/2008 | Preusse et al. | |

(Continued)

Primary Examiner — Vinh P Nguyen
(74) Attorney, Agent, or Firm — Dunlap Bennett & Ludwig, PLLC

(57) ABSTRACT

An auto ranging ammeter that allows improved measurement of rapidly changing, high-dynamic range electrical currents. The ammeter computes current during range switches by using digital signal processing to combine voltage measured over both a variable shunt resistor and a fixed shunt resistor. The ammeter uses fast comparators and digital processing to select the appropriate shunt resistor. The auto ranging ammeter includes a voltmeter which enables the device to output current, voltage, power, charge, and energy consumed by a target device under test.

14 Claims, 4 Drawing Sheets

(56) References Cited

U.S. PATENT DOCUMENTS

| | | |
|---|---|---|
| 7,812,619 B2 | 10/2010 | Tanida et al. |
| 7,834,613 B2 | 11/2010 | Ziegler et al. |
| 7,923,985 B2 | 4/2011 | Goeke et al. |
| 8,115,474 B2 | 2/2012 | Vulovic et al. |
| 9,506,953 B2 | 11/2016 | Deibele et al. |
| 9,529,016 B2 | 12/2016 | Aerts |
| 11,009,558 B2 | 5/2021 | Danesh et al. |
| 11,085,951 B2 | 8/2021 | Goeke et al. |
| 11,249,117 B2 * | 2/2022 | Liberty ................. G01R 15/09 |
| 2020/0150153 A1 | 5/2020 | Zimmerman et al. |
| 2020/0200922 A1 | 6/2020 | Berthold et al. |

* cited by examiner

AUTO RANGING AMMETER WITH ACCURATE MEASUREMENT DURING RANGE CHANGES

CROSS-REFERENCE TO RELATED APPLICATION

This application claims the benefit of priority to U.S. provisional application No. 63/185,200, filed May 6, 2021, the contents of which are herein incorporated by reference.

FIELD OF THE INVENTION

The present invention relates to test and measurement equipment for electronic devices. The invention is a test and measurement instrument intended for use by hardware engineers, software engineers and electronics enthusiasts to accurately measure electrical current. The invention allows improved measurement of electrical current, especially for rapidly changing, high-dynamic range currents and systems with brief current pulses.

BACKGROUND

The number of electronic devices that we purchase, use and control has grown significantly over the past decade. The power for these devices comes from electricity, which is characterized by its voltage (electrical potential) and current (number of flowing electrons). The electric power being consumed is the mathematical product of voltage and current. The total electric energy consumed is the mathematical integral of the power over time.

Measuring and accurately characterizing the power being consumed by these devices is becoming more critical. The battery life for battery-powered devices is strictly limited by the battery capacity and the amount of power consumed over time. Many of these devices are optimized to remain dormant or sleep most of the time, and they consume very little current in this mode. When the devices come awake to manage sensors, interact with the world around them and communicate with other devices, they may consume current many orders of magnitude larger than the sleep current. Some devices may rapidly toggle from a sleep state to a wake state and back again in microseconds. The present invention is a novel device for measuring the energy consumed by these devices with high-dynamic currents and rapid current changes.

Devices that measure electrical current are commonly called ammeters, and they have been in production for well over a century. The first ammeters in the 1800s were called "rheoscopes". Ammeters are typically optimized to measure either direct current or alternating current. Direct current is a current of a single positive or negative polarity. Alternating current switches from positive polarity to negative polarity, often at a fixed, specific frequency. Ammeters typically have fixed ranges of current measurement. On the high current side, they are limited by their design, ability to handle the current, and the amount of voltage drop that they impart on the system. On the low current side, they are limited by the noise floor and their analog sensing chain.

Ammeters with a single fixed range have limited utility. Many ammeters and other equipment that includes ammeters, such as multimeters, have a multitude of selectable ranges. Some ammeters have manually selectable ranges, and the operator configures the instrument for the desired range. Ammeters that can switch their current measurement ranges automatically based upon the measured current are called auto ranging ammeters.

The goal of most test equipment is to impart minimal change to the system they are measuring. Ammeters are inserted in the line of electrical current. Inevitably, the ammeters have some impedance that imparts a voltage drop over the ammeter. According to Ohm's law, $$voltage = current \times resistance$$

Existing equipment often imparts a voltage drop that is significant for modern digital components, which use 3.3V, 2.7V, 2.5V, 1.8V, 1.2V, 0.9V and even 0.6V supplies. Minimizing the ammeter voltage is critical for measurement accuracy with modern electrical devices.

Auto ranging ammeters usually have a momentary "glitch" when switching current ranges that adds error to the measured value. The duration and magnitude of the error varies by measurement technology and implementation. U.S. Pat. No. 11,249,117 discloses a novel ammeter that quickly auto ranges, but still imparts a measurement error for up to 5 µs. The error increases as the signal bandwidth increases. For pulses, the error increases as the pulse width decreases.

Devices are getting faster in transitioning between operating modes resulting in even shorter on durations, which results in increasing error due to more current range switching. As can be seen, there is a need for an improved auto ranging ammeter that continues accurate measurements through current range changes.

BRIEF SUMMARY OF THE INVENTION

The present invention is an auto ranging ammeter that can accurately measure current, even when the current quickly changes by many orders of magnitude. The auto ranging ammeter contains multiple current sense resistors that measure different current ranges. The auto ranging ammeter dynamically selects the appropriate current sense resistor based upon the actual current. The auto ranging ammeter selects lower value current sense resistors for higher current and higher value current sensor resistors for lower current. Selecting the appropriate range for constant currents is trivial and is implemented by common multimeters. Selecting the appropriate range for rapidly changing currents is much more difficult. The present invention uses a novel combination of a less sensitive, always on current sense resistor that is combined seamlessly with the measurement over the dynamically selected sense resistor. Due to the novel functionality of the present invention, overrange selection can jump to the least sensitive range while maintaining accuracy. Many other instruments either only jump a single range or attempt to estimate the target range. When current decreases, the ammeter dynamically selects between higher value current sense resistors by comparing the ammeter digital value output over time.

The auto ranging ammeter also includes a voltmeter and additional processing. The processing applies calibration coefficients, computes power, computes charge, and computes energy. The auto ranging ammeter includes software running on a general-purpose computing platform that can display current, voltage, power, energy, and charge over time.

The auto ranging ammeter achieves significant performance at a reduced cost compared to contemporary ammeters. The auto ranging ammeter is designed to measure currents up to ±3 A with 1 nA resolution. The auto ranging ammeter supports limited duration current bursts up to ±10

A. The present invention also measures voltages from −15 V to 15 V with 1 mV resolution. The auto ranging ammeter has a sampling frequency of 2 million samples per second with a 300 kHz bandwidth.

This invention improves upon U.S. Pat. No. 11,249,117, which is incorporated here by reference. In contrast to U.S. Pat. No. 11,249,117, the present invention offers accurate measurement during current range switching and provides full, four-quadrant (±current, ±voltage) operation.

These and other features, aspects and advantages of the present invention will become better understood with reference to the following drawings, description, and claims.

DETAILED DESCRIPTION AND BEST MODE OF IMPLEMENTATION

The following detailed description is of the best currently contemplated modes of carrying out auto ranging ammeters of the invention. The description is not to be taken in a limiting sense but is made merely for the purpose of illustrating the general principles of the invention, since the scope of the invention is best defined by the appended claims.

Broadly, embodiments of the present invention provide a system, method, and apparatus to measure the voltage, current, power, energy and charge consumed by a target device under test (DUT).

Figure 1:
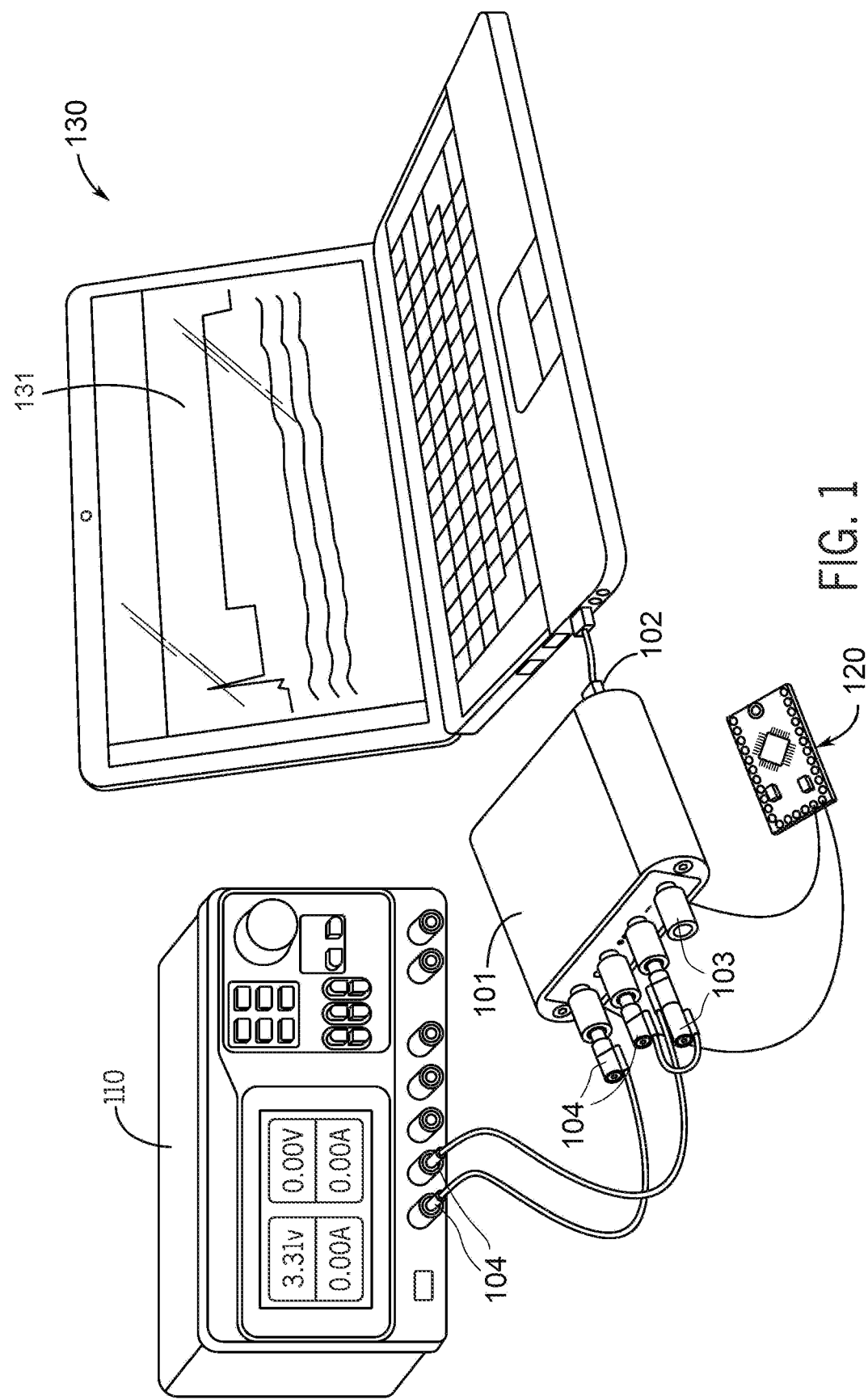
FIG. 1 is a view of a representative setup of an auto ranging ammeter in use to perform measurements on a device under test (DUT).
Figure 2:
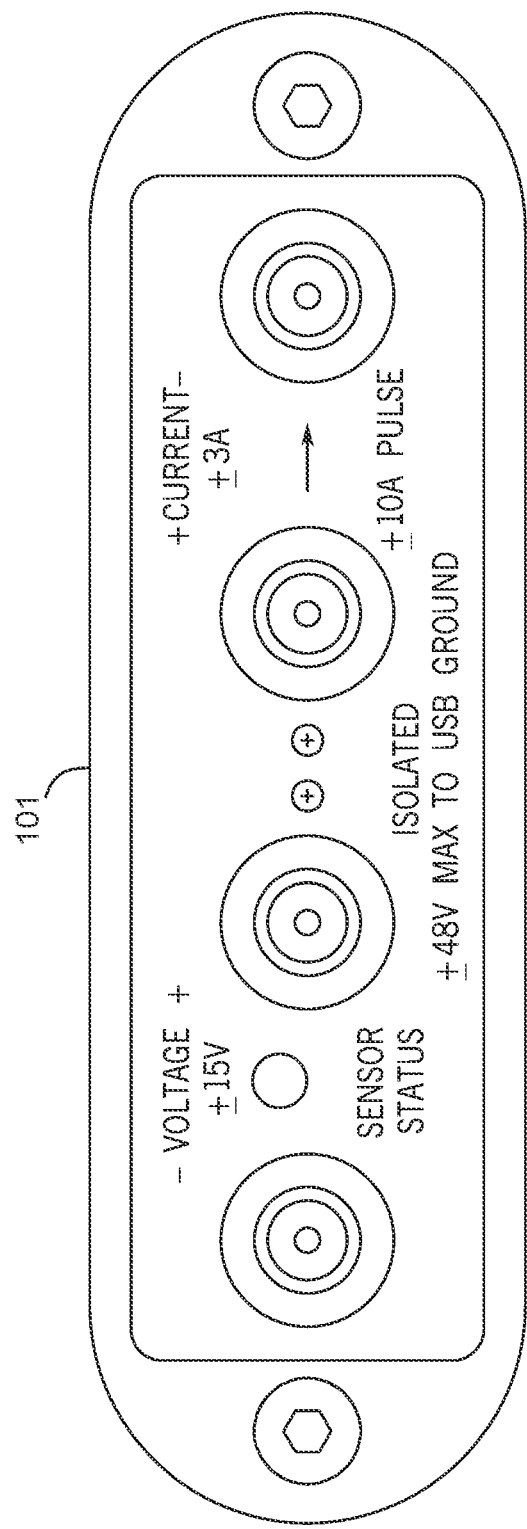
FIG. 2 presents a detailed view of the front of the present invention showing the sensor connections.

As shown in FIG. 1, a representative system employing the present invention includes: an auto ranging ammeter 101, a power supply 110, a device under test 120 and a host computing device, such as a personal computer (PC) 130. The power supply 110 can be any type of power supply to provide a power source for the DUT 120, including a DC bench supply, an AC-DC power adapter, and a battery.

The device under test 120 can be any device of interest, including a microcontroller, an assembled printed circuit board, an entire product, an electronic subassembly, and a simple resistor. FIG. 1 shows an assembled printed circuit board device under test 120. The host PC 130 can be any host USB computing device that is in communication with an output of the auto ranging ammeter 101. The host PC 130 may have any compatible operating system, including a Microsoft® Windows PC, a Linux PC, an Apple® Macintosh and a Raspberry Pi running Linux. One skilled in the art will recognize that the examples given for 110, 120, and 130 are demonstrative only and that other combinations are possible without affecting the present invention.

Multiple connection types are possible between the power supply 110, the auto ranging ammeter 101 and the target device under test 120. By way of non-limiting example, the connection 104 may include binding posts which allow for low voltage drop across the connections. The connections 104 use a conductor of suitable wire gauge. The auto ranging ammeter 101 includes an interchangeable front panel to support other connector types. Common alternative connector types include BNC connectors with RG48/U coax cable, SMA connectors with RG316 coax cable, rectangular connectors with ribbon cable, rectangular cables with wire, banana jacks with wire, safety banana jacks with wire, USB connectors with USB cables, terminal blocks with wire, and the like.

In the non-limiting embodiments shown, the auto ranging ammeter 101 communicates with the Host PC 130 over a Universal Serial Bus (USB) connection 102. The auto ranging ammeter 101 and the USB connection 102 may uses a USB 2.0 Bulk mode or a USB 2.0 isochronous mode to convey the outputs from the auto ranging ammeter 101 to the input of the host PC 130. One skilled in the art will recognize that other communication mechanisms are possible, including but not limited to USB 3.0, ethernet, and Wi-Fi. The auto ranging ammeter uses off-the-shelf USB drivers including libusb and WinUSB to interface with the auto ranging ammeter 101.

The Host PC 130 runs software written in any suitable programming language, such as C and Python, that is configured to communicate with the auto ranging ammeter and processes the data received. The software may include a graphical user interface (GUI) 131 to display the outputs of the DUT 120, measured by the auto ranging ammeter 101 and allow the operator to explore the data. Exploration options including record, save, load, zoom and a pan of the measured data. The GUI 131 may display current with linear axes or logarithmic axes. Due to the wide dynamic range of many target DUTs 120, logarithmic axes are often more useful to the operator. The GUI 131 may display numerous user-selectable measurement values, individually or simultaneously, including current, voltage, power, energy, charge, program counter, and logging output from the target DUT 120.

Figure 3:
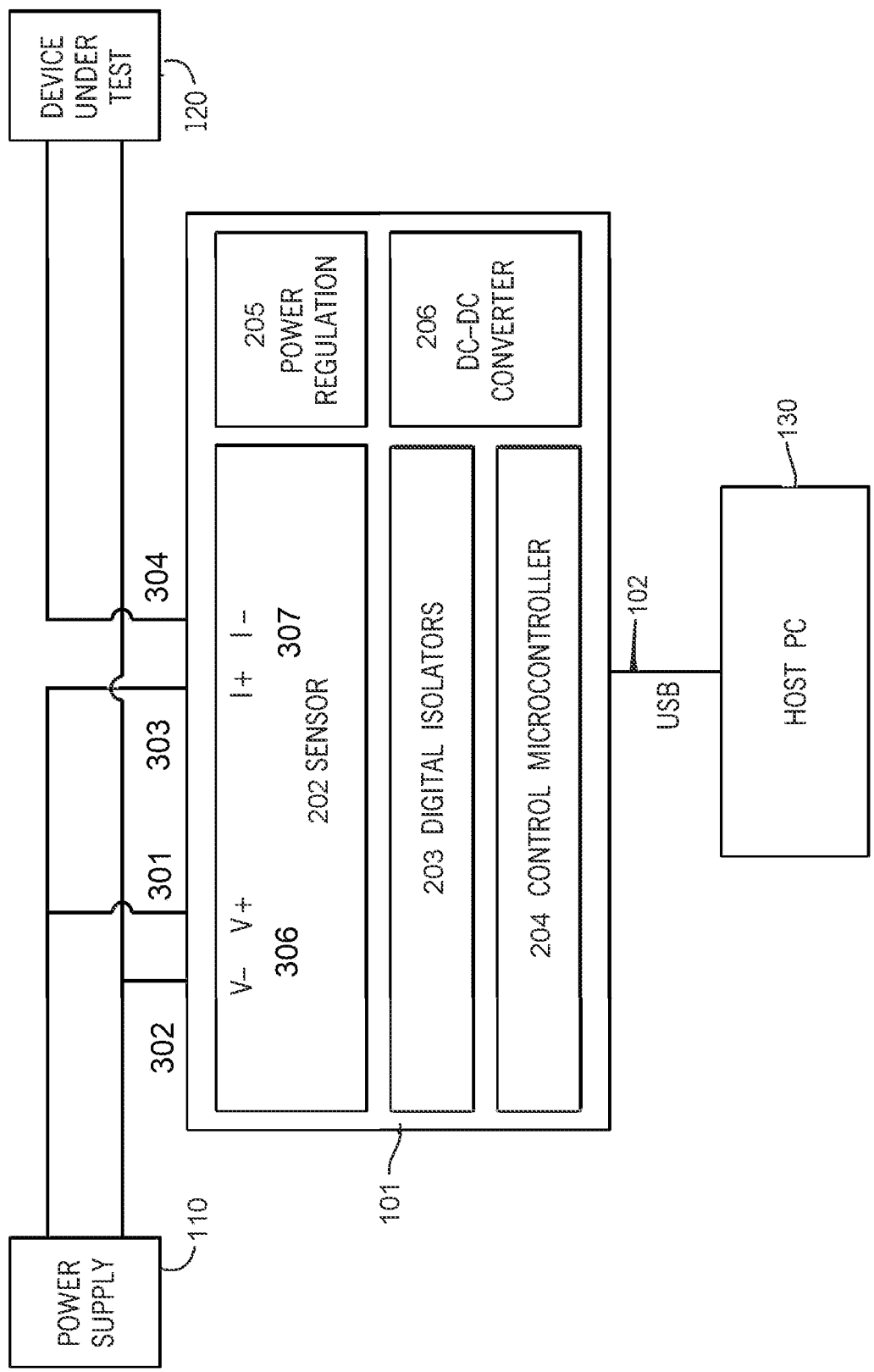
FIG. 3 presents a block diagram of a representative setup of an auto ranging ammeter in use to perform measurements with a block diagram of the present invention.

FIG. 3 shows a block diagram of FIG. 1 with the auto ranging ammeter 101, the power supply 110, the device under test 120, and the host computer 130. The auto ranging ammeter 101 includes several primary subsystems including the sensor 202, the digital isolators 203, the control microcontroller 204, the sensor power regulation 205, and an isolated DC-DC converter 206.

The auto ranging ammeter 101 may be powered over a USB 102 and provides sensor 202 power through the isolated DC-DC converter 206 and then the sensor power regulation 205. The auto ranging ammeter 101 may utilize the TI ISO7762 for the digital isolator 203. The auto ranging ammeter 101 may utilize the TI SN6505B driver and a Wurth 750316018 transformer for the isolated DC-DC converter 206. The digital signal isolators 203 and an isolated DC-DC converter 206 allow the sensor's 202 electrical ground to be completely independent of the host PC 130.

The control microcontroller 204 receives the data from the sensor 202, specifically a field programmable gate array (FPGA) 370 and communicates with the host PC 130 over the high-speed USB connection 102. The controller microcontroller 204 also communicates with the FPGA 370 over an isolated UART interface. The auto ranging ammeter 101 may utilize a Microchip ATSAMS70 as the control microcontroller 204.

One skilled in the art will recognize that careful design is required for the isolated DC-DC converter 206 and the power regulator 205. The auto ranging ammeter 101 limits the voltage across the shunt resistors 310-315 to ±20 mV maximum. On the 16-bit ADCs 360-363 used by the auto ranging ammeter 101, the least significant bit (LSB) represents about 0.6 μV at the shunt resistor. Power supply noise can easily couple into the signal path through a variety of methods and reduce the effective resolution of the instrument. Implementing the present invention requires careful attention to analog design of both the analog signal path and the power regulation.

Figure 4:
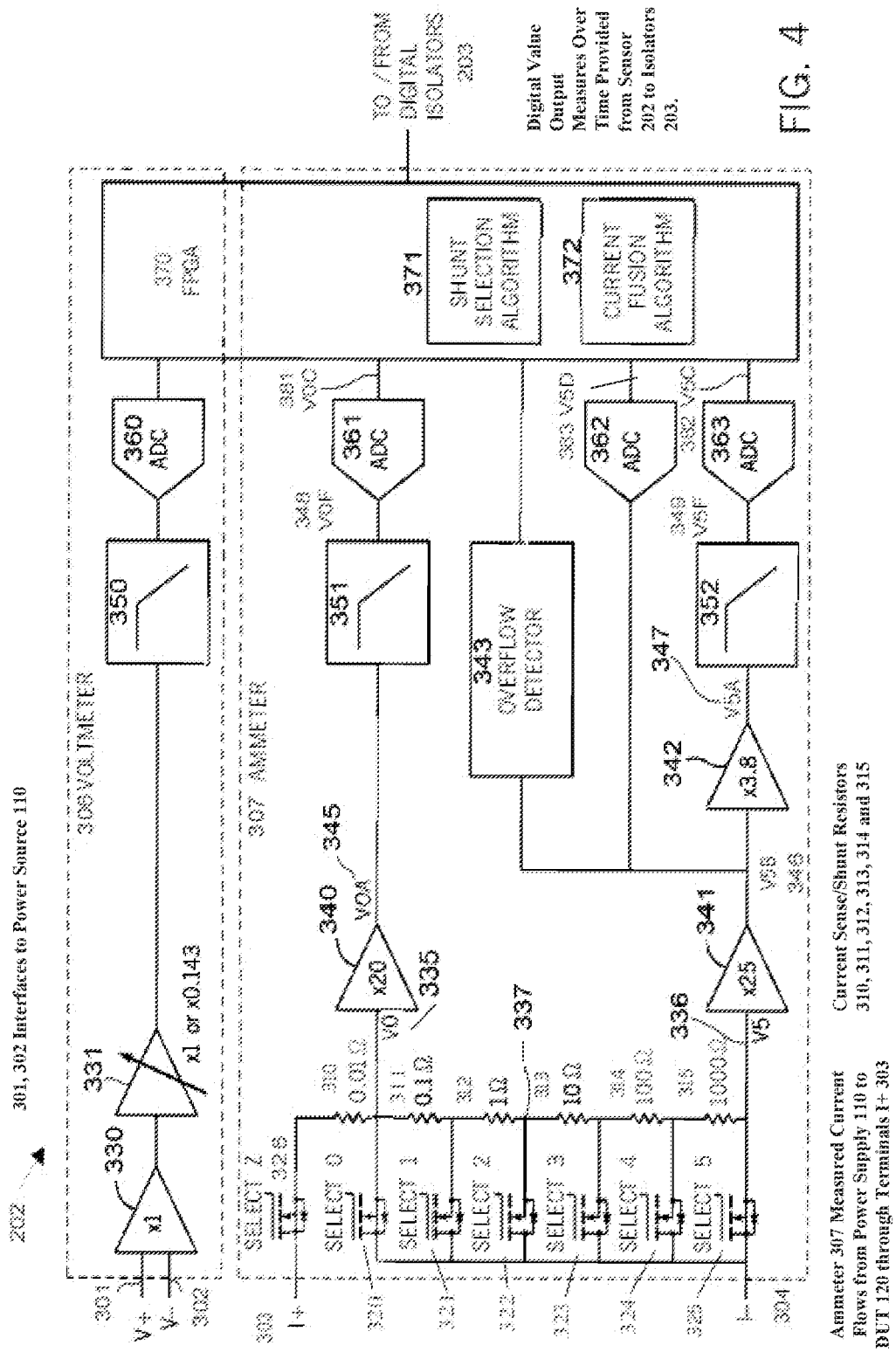
FIG. 4 is a block diagram of the sensor subsystem of the of the present invention.

FIG. 4 shows a detailed view of the sensor 202. The voltmeter 306 measures the voltage from V+ 301 to V− 302. The voltmeter 306 includes a unity-gain instrumentation amplifier (inamp) 330, a programmable gain amplifier 331, a low pass filter 350, an analog-to-digital converter 360, and an FPGA 370. The voltmeter 306 may be configured using a high impedance inamp, such as the INA821 manufactured by Texas Instruments (TI). The voltmeter 302 may further be configured using an operational amplifier (opamp) divider, such as the TI OPA2388, and an analog-to-digital converter (ADC) 360, such as the TI ADS9226.

As seen in reference to FIG. 4, the auto ranging ammeter 307 accurately measures the current flowing from input I+ 303 to output I− 304 of the auto ranging ammeter 307. The present invention passes the current through a plurality of resistors 310, 311, 312, 313, 314 and 315 in a series connection, with each of the plurality of the resistors 310, 311, 312, 313, 314 and 315 having a known value, measures the voltage across the plurality of resistors, and then computes current using Ohm's law. Common terms for these resistors are "shunt resistors" and "current sense resistors". The present invention uses two or more shunt resistors 310, 311, 312, 313, 314 and 315 of different values which may be connected or disconnected from the circuit.

In the non-limiting embodiment shown in FIG. 4, the auto ranging ammeter 307 uses six different resistors 310, 311, 312, 313, 314 and 315 with values of 0.01 Ohms, 0.1 Ohms, 1 Ohm, 10 Ohms, 100 Ohms and 1000 Ohms, respectively. Since they are connected in series, the selectable resistances are then 0.01 Ohms, 0.11 Ohms, 1.11 Ohms, 11.11 Ohms, 111.11 Ohms and 1111.11 Ohms, respectively. The auto ranging ammeter 307 may also use N-channel metal-oxide-semiconductor field-effect transistors (MOSFETs), to connect each shunt resistor to the output 304. The selection MOSFETs are 320, 321, 322, 323, 324 and 325. In addition, the N-channel shutoff MOSFET 326 can prevent the reverse flow of current due to the parasitic body diode present in all MOSFETs. When shutoff MOSFET 326 is enabled along with one of the selection MOSFETs 320-325, current can flow from the input I+ 303, through the shutoff MOSFET 326, though the selected resistor(s), through the selection MOSFET and then out the output 304. The voltage across the first resistor 310 in the auto ranging ammeter 307 is then 0.01 Ohms*current. For a 1 ampere (A) current, the voltage would be 10 millivolts (mV).

The auto ranging ammeter 307 measures the voltage at node $V_O$ 335 and node $V_s$ 336. Although V5 is not directly connected to resistor 310, V5 is connected through resistors 311, 312, 313, 314 and 315. With careful design, the amount of current flowing through resistors 311, 312, 313, 314 and 315 can be very small when selection MOSFET 320 is selected, so that the voltage at node V5 336 is approximately equal to the voltage at node V0 335. Note that the voltage across 310 will be negative with respect to 303 given the direction of current from I+ 303 to I− 304.

The auto ranging ammeter 307 allows for different resistance values to enable different current ranges. If selection MOSFET 320 is disabled and selection MOSFET 321 is enabled, then current must flow through both resistor 310 and resistor 311. The total resistance is then 0.11 Ohms. In this configuration, the voltage at node V5 336 is 11 times more sensitive to when only selection MOSFET 320 is enabled. This process can be repeated for each shunt resistor. When only selection MOSFET 325 is enabled, the total resistance is 1111.11 Ohms. In this configuration, the voltage at node V5 336 is 111111 times more sensitive to when only selection MOSFET 320 is enabled.

One skilled in the art will recognize that the auto ranging ammeter 307 is fully symmetric. The auto ranging ammeter 307 will still measure correctly if the I+ 303 and I− 304 are reversed. The auto ranging ammeter 307 measures positive currents, negative currents, positive voltages, and negative voltages, so the notion of input and output is for polarity convention only.

The resistance values shown in FIG. 4 are those used in the auto ranging ammeter 307. However, one skilled in the art will recognize that other resistance values may be selected to achieve the same result. One skilled in the art will also recognize that the MOSFETs must be selected for the current rating of its paired sense resistor range.

A prior invention described by U.S. Pat. No. 11,249,117 used P-channel MOSFETS. The present invention uses N-channel selection MOSFETS with the addition of shutoff MOSFET 326, which allows I+ ground referencing while preventing the current flow when the auto ranging ammeter 307 is unpowered. All MOSFETs have a parasitic body diode that can conduct electricity in the reverse direction. N-channel MOSFETs also have lower gate capacitance than P-channel MOSFETs which allows the auto ranging ammeter 307 to have improved performance. The cost of this enhancement is the additional drain-source resistance from shutoff MOSFET 326. One skilled in the art will recognize that this present invention can be constructed with P-channel MOSFETs instead of N-channel MOSFETs. Finally, the shutoff MOSFET 326 allows for soft-fuse operation irrespective of the current flow polarity, a limitation of the prior invention in U.S. Pat. No. 11,249,117.

The digital field programmable gate array (FPGA) 370 processes the outputs of the auto ranging ammeter 307 and voltmeter 306. The FPGA 370 contains custom digital logic, a soft microcontroller RISC-V core and custom DSP engine cores. The FPGA 370 examines the ADC 360-363 outputs and overflow detector 343 outputs to enable one of the selection MOSFETs 320-325, which in turn configures the current shunt resistance. The auto ranging ammeter 307 may utilize a LFESU-25, manufactured by Lattice Semiconductor, for the sensor FPGA 370.

The N-channel MOSFETs are enabled when the gate voltage is sufficiently greater than the source voltage. The FPGA 370 outputs signals at +3.3V which may not be sufficient to directly drive the N-channel MOSFETs' gates. The auto ranging ammeter 307 may utilize a fast level shifter, such as the TI SN74LXC8T245, referenced to a 4.5V supply to drive the MOSFET gates. The auto ranging ammeter 307 also includes series-limiting resistors between the level shifter and the MOSFET gate. This resistor limits the slew rate and the impact of gate capacitance on the auto ranging ammeter 307 measurement.

The voltages at node V0 335 and node V5 336 have low amplitude, and they are amplified by amplifiers 340 and 341, respectively, into node V0A 345 and node V5B 346. The voltage at node V5B 346 is further amplified by amplifier 342 to produce the voltage at node V5A 347. The amplified voltages V0A and V5A are then passed through low pass filters 351 and 352, respectfully, to produce V0F 348 and V5F 349, respectively. The low pass filters 351 and 352 may be $6^{th}$ order analog Butterworth anti-aliasing filters with a 315 kHz cut-off frequency. The low-pass filters condition the signal to avoid aliasing by the analog-to-digital converters (ADCs) 361 and 363. Each ADC converts the input analog signal into a digitized, integer sample value that is proportional to the input analog signal at a rate of 2 million samples per second. ADC 361 digitizes V0F 348 to produce the digitized integer value V0C 381. ADC 363 digitizes V5F 349 to produce the digitized integer value V5C 382. The ADC 362 converts the unfiltered voltage at node V5B 346 into a digitized integer value V5D 383. Although the signal V5D 383 will have aliasing, it will also converge faster after shunt resistor changes. One skilled in the art will recognize that these ADCs may be 4 separate components or combined as a multichannel component. The auto ranging ammeter 307 may utilize two dual-channel TI ADS9226 ADCs.

The auto ranging ammeter 307 uses at least two different voltage sense nodes V0 335 and V5 336. However, additional voltage sense nodes, such as node 337, could be used for improved performance, with the downside of a larger and more expensive device.

The digital processing in the FPGA 370 applies a calibration to convert the proportional digital integers V0C 381, V5C 382 and V5D 383 into values in the actual units of amperes. The current fusion algorithm 372 seamlessly combines the different calibrated current measurements based upon V0C 381, V5C 382 and V5D 383 to produce the final current output value. The selected shunt resistance is controlled by the shunt selection algorithm 371. The selection is performed using the overflow detector 343 outputs, V0C 381, V5C 382, V5D 383, and time.

The voltage at node V0 335 is the current*0.01 Ohms when the shutoff MOSFET 326 and at least one of the selection MOSFETs 320, 321, 322, 323, 324, 325 are enabled. With 20 times signal amplification at amplifier 340, 10 A from I+ to I− becomes 2V after amplifier 340. The auto ranging ammeter uses a high-speed 16-bit ADC that produces $2^{16}$ possible values. With a ±10 A range, the 16-bit ADC's least significant bit is equivalent to 20 A/$2^{16}$=305 µA. To accurately represent ±10 A with 1 nA resolution requires 2*10/1e−9=20,000,000,000 possible values, which is approximately 34.3 bits. Therefore, a 16-bit ADC alone cannot span the entire measurement range with the desired resolution.

One foreseen enhancement is to use two or more different selectable gains for amplifier 340. Another foreseen enhancement is to use two or more separate parallel paths from voltage node V0 335 to the FPGA 370, each including an amplifier, a low-pass filter, and an ADC. In this enhancement, each path has a different gain to extend the measurement range. The FPGA 370 would then seamlessly select the path with the most appropriate gain for the input signal. However, the maximum useful gain is determined by the noise of the amplifiers and ADC. Another foreseen enhancement is to select an ADC with more bits and resolution.

The measurement voltage at node V5 336 provides the dynamic current measurement range beyond what is possible for measurement voltage at node V0 335 alone. The main amplification path through amplifier 341 and amplifier 342 provides a total gain of 95. This converts the ±20 mV signal into ±1.9V for the ADC 363. The output of amplifier 341 connects to the overflow detector 343 with a gain of 25. The overflow detector 343 rapidly determines when the current exceeds the signal range for the selected shunt resistor. Since the overflow detector 343 uses the signal before the low pass filter 352, it can detect overflow quickly. With a lower gain, it also avoids opamp saturation which requires time to recover. The auto ranging ammeter 307 uses four comparators to detect four thresholds set to ±21.0 mV and ±23.0 mV as measured at node V5 336. The auto ranging ammeter 307 uses two Texas Instruments TLV3202 dual-channel comparators.

The overflow detector 343 can employ digital-to-analog converts (DACs) or digital potentiometers to adjust the overflow threshold. The overflow detector 343 could alternatively use a separate high-speed ADC, such as found in the STM32G491. An ADC-based overflow detector 343 can enable software-programmable thresholds which can yield improved shunt resistor selection performance.

The auto ranging ammeter 307 is designed to be very high impedance. This high impedance enables it to accurately measure very low currents on the order of nA. While typical oscilloscopes and multimeters have impedances of 1 MΩ to 10 MΩ, the present embodiment is designed to have an input impedance exceeding 1 GΩ. The selection of MOSFETs, the first-stage ammeter amplifiers 340 and 341 and the first stage inamp 330 are critical to proper operation. All components connected to the external interfaces 301, 302, 303 and 304 that must have very low leakage. The first-stage ammeter amplifiers 340 and 341 must also have very low offset voltage and sufficient gain-bandwidth product for the signals of interest. To achieve the desired bandwidth, the amplifiers 340 and 341 may consist of multiple opamps whose gain product equals the target gain. The auto ranging ammeter 307 amplifier 340 may use the two TI OPA2388 opamps configured for 5× and 4× gain, respectively. The auto ranging ammeter 307 amplifier 341 may use the two TI OPA2388 opamps configured for 5× and 5× gain, respectively.

One skilled in the art will recognized that inamps may be used instead of an opamps for amplifiers 340 and 341. The inamp will help reduce error from printed circuit board parasitic resistance. Compared to opamps, inamps will typically have larger noise and offset variation error over temperature since they are typically constructed from 3 opamps.

The auto ranging ammeter 307 uses the ADC output, the active shunt resistor, and calibration coefficients to compute the current. The auto ranging ammeter 307 is designed to be linear, so the trivial linear transformation for each channel is:

current=(ADC_output−offset)*scale

Due to the architecture of the present embodiment, the offset measured for each V0C 381, V5C 382, V5D 383 does not typically vary with different shunt resistor values. The scale for V5C 382 and V5D 383 varies based upon the active shunt resistor. One skilled in the art will recognize that these calibration coefficients can be computed once based upon the design, computed for each device during manufacturing, and/or computed after manufacturing. The auto ranging ammeter 307 uses calibration coefficients computed for each device at manufacturing to eliminate the effect of manufacturing variations. The auto ranging ammeter 307 also allows for a recalibration service after manufacturing. The auto ranging ammeter 307 may also automatically calibrate offset in the field, by either disabling all MOSFETS or by asking the operator to disconnect the inputs and outputs manually.

The calibration process described above is for a simple linear equation, which is suitable for the accuracy of the auto ranging ammeter 307. One skilled in the art will recognize that the calibration process can compensate for additional factors. Additional factors may include temperature, nonlinearity, power supply voltage, humidity, atmospheric pressure, mechanical stress, and component aging.

One skilled in the art will recognize that applying calibration to compute current may be performed in one or more places without altering the present invention. The current may be computed in the sensor FPGA 370 digital gateware, software within a microcontroller DSP core in the FPGA 370, the control microcontroller 204, and the Host PC 230. The computation of voltage, power, energy, and charge may likewise be performed in any or all these locations. Some features, such as soft-fuse and the shunt selection algorithm 371, may require current to be calculated in the sensor FPGA 370 to enable a sufficiently fast response. The auto ranging ammeter 307 applies the calibration in the sensor FPGA 370 gateware.

The shunt selection algorithm 371 has inputs including the overvoltage threshold signals from the overflow detector 343, V0C 381, V5C 382, V5D 383, and time. With the simplest implementation, when the shunt selection algorithm 371 receives an overflow indication from the overflow detector 343, it asserts select 0 to enable selection MOSFET 320. A short time later, it deasserts all other selection MOSFETs. This allows make-before-break operation to keep current flowing normally to the device under test. The actual duration can be tuned to the turn-on times of each MOSFET. The auto ranging ammeter 307 uses a 200 ns deassertion time.

For underflow, the FPGA 370 monitors the ADC 363 output value V5C 382. When the value V5C 382 drops below a threshold, the shunt selection algorithm 371 will enable the select signal to turn on the next most sensitive selection MOSFET 320-325. The threshold must be below the maximum measurement range of the next level, which is 10% of 20 mV=2.0 mV. However, an additional margin is required to allow for variations and inrush/outrush current. The value must be large enough to ensure adequate precision at the ADC. The auto ranging ammeter 307 targets 0.1% accuracy. The ADC 363 is 16-bits with 15 effective number of bits (ENOB). The ADC measures over the ±20 mV range which consumes approximately 85% of the full, available ADC range. Therefore, 0.1% accuracy occurs at $2*20/0.85/2^{15}/0.001=1.4$ mV, which is below the 2-mV range that becomes full-scale in the next most sensitive range.

The auto ranging ammeter 307 does not immediately select the next most sensitive range on an underflow condition. Instead, it waits for some time to ensure that the range switch is necessary and not due to a short-term event. The underflow duration to select the next most sensitive range may vary based upon the current range, typically with increasing durations for more sensitive ranges due to the increased settling time. The settling time is limited by the shunt resistor value and the capacitance on the device under test 120. Together, they form a low-pass filter. The present embodiment uses 15 μs, 25 μs, 50 μs, 100 μs, and 2 ms when enabling selection MOSFETs 321, 322, 323, 324, and 325, respectively. One skilled in the art will recognize that other durations, including dynamically adaptive durations, are possible. The selection MOSFET for the next most sensitive range is enabled before disabling the previous selection MOSFET. This allows a make-before-break operation to keep current flowing normally to the device under test 120.

The auto ranging ammeter 307 only activates the next larger shunt resistor on an underflow condition. A foreseen improvement is to allow the underflow range selection to skip shunt resistor values based upon the ADC values. The present invention has sufficient accuracy to enable this operation. For example, if the digital logic detects that the voltage is only 0.1 mV, then it could skip over one shunt resistor value.

The threshold algorithm in the auto ranging ammeter 307 is given by the following pseudo-code:

```
if OVERFLOW
    select <= 0
    range_underflow_count = 0
elif sample available and T_UNDERFLOW_NEG < value < T_UNDERFLOW_POS:
    if range_underflow_count > range_counter_threshold[select]:
        select <= select - 1
        range_underflow_count = 0
    else:
        range_underflow_count += 1
else:
    range_underflow_count = 0
```

The range_underflow_count is a counter that enables switching to more sensitive ranges with high current shunt resistor values. The range_underflow_count is compared against the range_counter_threshold, which may be different for each current range. This allows for variable underflow durations. A foreseen improvement could use specific time thresholds for the transition to each sense resistor. Another foreseen improvement could dynamically estimate the power supply 110 and DUT 120 capacitances based upon previous shunt resistor range switching settling times and dynamically adapt the time thresholds, specifically for the power supply 110 and DUT 120. This later improvement could minimize the switching delay on underflow to maximum measurement resolution.

The auto ranging ammeter 307 has sufficient precision on the measurement of node V0 335 so that the auto ranging ammeter 307 can always switch to select 0 on overflow to maintain dynamic accuracy. However, the present embodiment can also restrict the shunt resistor operating range for even greater dynamic accuracy. If a DUT 120 never draws more than 100 mA, then overflow only needs to jump to the second shunt resistor 311, not the first shunt resistor 310. The present embodiment includes a feature that allows the operator to specify the largest and smallest current range, which further constrains the sense resistor range selection algorithm 371.

The shunt selection algorithm 371 may also adapt to learn the patterns of the target device 120 to predict the target range, particularly on overflow. A correct prediction can minimize the number of range switches. An incorrect prediction can increase the number of range switches and increase the effective burden voltage. One skilled in the art will recognize that the shunt selection algorithm 371 can implement multiple adaptive current range algorithms that the operator may optionally select through software.

The auto ranging ammeter 307 also includes dual thresholds on each positive and negative polarity. The shunt selection algorithm 371 can be configured to implement the shunt selection algorithm described by U.S. Pat. No. 11,249, 117.

One skilled in the art will recognize the each MOSFET has a gate-source leakage current and drain-source leakage current that must be considered for the optimal operation. The present embodiment turns off all selection MOSFETs except for the selection MOSFET for the selected current shunt resistor to minimize gate-source leakage.

The auto ranging ammeter 307 uses calibrations and all three ADC outputs V0C 381, V5C 382, and V5D 383 to compute the current in the current fusion algorithm 372. The current fusion algorithm 372 outputs the measured current in amperes. In select 0 with selection MOSFET 320 enabled, the current fusion algorithm 372 normally uses the value V0C 381 with calibration applied for currents with amplitudes larger than ±2 A. For values within ±2 A, the current fusion algorithm 372 normally uses the value V5C 382 with calibration applied. When the shunt selection algorithm 371 selects other ranges, the current fusion algorithm 372 uses the value V5C 382 with calibration applied.

The current fusion algorithm 372 uses the V5C 382 calibrated output value to dynamically adjust the calibration parameters for the V0C 381 value. The shown embodiment uses a single-pole infinite impulse response (IIR) filter with a 1 second time constant to adjust the V0C 381 calibrated offset so that the value matches the V5C 382 calibrated offset.

During range switches, the value at node V0 335 and V5 336 experience a brief voltage spike from switching transients due to the gate capacitance of the selection MOSFETs 320, 321, 322, 323, 324, 325. The current limiting resistors between the MOSFET drivers and their gates determine the duration and amplitude of this spike. The auto ranging amplifier 101 selects current limiting resistors to make the duration approximately 200 ns. This voltage spike is further filtered, and time extended by the low pass filters 351 and 352.

The voltage spike characteristic for node V0 335 may be characterized for each combination of current range change. The current fusion algorithm 372 subtracts out the characterized voltage spike from the signal V0C 381 to produce an improved output with much lower error. One skilled in the art will recognize that this characterization can be performed once for all devices, in the factory for each device or even in the field. The auto ranging ammeter 307 is characterized in the factory for each device. Upon range changes, the current fusion algorithm 372 uses the improved V0C 381 value. When the V5C 382 value converges on the new selected shunt resistor signal, the current fusion algorithm 372 returns to producing the current output using V5C 382 calibrated value. In the auto ranging ammeter 307, the current fusion algorithm 372 waits for 10 μs for the V5C 382 value to converge after current range switches.

While the offset corrected V0C 381 has the correct mean, it often has limited resolution compared to node V5 336. The auto ranging ammeter 307 includes an optional enhancement that improves resolution and accuracy during current range changes. The enhancement uses a separate digitized integer value V5D 383 produced by another ADC 362. This channel explicitly omits the low pass filter to allow for faster convergence. By omitting the low pass filter, this channel is susceptible to sample aliasing, which is normally undesirable. However, it can usually measure accurate values. When this signal converges 1.5 μs after the range switch, the current fusion algorithm 372 compares the calibrated values produced from V0C 381 and V5D 383. If the calibrated V5D 383 value lies within the precision of the calibrated V0C 381 value, the current fusion algorithm 372 produces the current output using the calibrated V5C 383 value. Otherwise, the current fusion algorithm continues to use the calibrated V0C 381 value.

The current fusion algorithm 372 further applies filtering on current range switching. The filtering smooths out the signal so that it maintains the normal bandwidth, which is approximately 300 kHz for the auto ranging ammeter 307. One skilled in the art will recognize that multiple filtering options are available including finite impulse response (FIR), infinite impulse response (IIR), exponential smoothing, polynomial smoothing, and spline fitting. The present embodiment uses an FIR filter.

The current fusion algorithm 372 in the present embodiment is a procedural, finite state machine implementation. One skilled in the art will recognized that other fusion algorithms are possible, which may also compensate for additional inaccuracies in gain, nonlinearity, voltage spikes, and filtering artifacts. Foreseen alternatives include adaptive FIR filters, adaptive IIR filters, Kalman filters, Extended Kalman filters, machine learning algorithms, and artificial intelligence (AI) algorithms.

The auto ranging ammeter 307 communicates between the FPGA 370 and the control microcontroller 204 using four signals: a 48 MHz clock, a chip select, and two data bits. The FPGA 370 sends digital messages using a robust protocol with retransmissions on errors. The control microcontroller 204 receives the data using two of its separate serial peripheral interface (SPI) peripherals. The control microcontroller 204 then sends the sample data to the host PC over USB 102.

The auto ranging ammeter 307 uses N-channel selection MOSFETs and shunt resistors in a "low-side" current sensing configuration. The system zero voltage reference, often called electrical "ground", is relative to I+ when shutoff MOSFET 326 is enabled. This configuration enables the auto ranging ammeter 307 to turn off all selection MOSFETs under software control, which in turn disables current to the device under test 120. The auto ranging ammeter 307 uses this feature to implement a software-controlled fuse, often called a soft fuse.

When the soft fuse activates, it shuts off power to the device under test 120. The soft fuse uses the current, voltage, and time as inputs. The soft fuse can activate for numerous, configurable conditions. The simplest condition is if the current exceeds a preset threshold over a preset time duration. Another condition is if the charge or energy exceeds a preset threshold over a time duration. One skilled in the art will recognize that multiple conditions and thresholds of varying durations and mechanisms can be set simultaneously. With suitable digital logic and/or software, the soft fuse can have both high-current fast-trip and longer term slow-trip functionality, simultaneously. In the auto ranging ammeter 307, this soft fuse feature works regardless of the connection polarity.

The auto ranging ammeter 307 also uses a fully isolated power supply for the sensor. This design choice eliminates ground loops and reduces measurement noise in the typical test system.

One skilled in the art will recognize that the auto ranging ammeter 307 can have additional features to enhance its utility. Foreseen additional features include general purpose digital inputs, general purpose digital outputs, trigger inputs, trigger outputs, general purpose analog inputs, general purpose analog outputs, microcontroller debug interfaces, and microcontroller trace interfaces. Microcontroller debug and trace interfaces can enable the auto ranging ammeter 101 to map power usage to software code lines.

It should be understood, of course, that the foregoing relates to exemplary embodiments of the invention and that modifications may be made without departing from the spirit and scope of the invention as set forth in the following claims.

What is claimed is:

1. An auto ranging ammeter for measuring an electrical current comprising:
   a shutoff metal-oxide-semiconductor field-effect transistor (MOSFET) that connects to an input of the auto ranging ammeter;
   a plurality of shunt resistors in a series connection, a first end of the series connection attached to the shutoff MOSFET;

a selection MOSFET electrically connected between each of the plurality of shunt resistors in the series connection and an output of the auto ranging ammeter, each selection MOSFET operable to select a shunt resistor value from the plurality of shunt resistors;

a shunt selection block to selectively enable and disable each selection MOSFET;

at least one first operational amplifier (OPAMP) configured to amplify a first shunt resistor voltage V0 to an amplified first shunt resistor voltage VOA;

at least one second OPAMP configured to amplify a selected shunt resistor voltage V5 to an amplified selected shunt resistor voltage V5A;

a first analog to digital converter (ADC) connected to an amplifier output of the at least one first OPAMP to provide a digitized first shunt resistor voltage V0C;

a second ADC connected to an amplifier output of the at least one second OPAMP to provide a digitized selected shunt resistor voltage V5C; and a measured current output having a value dependent on a selection of one or more MOSFETs, the value calculated from the digitized first shunt resistor voltage VOC and the digitized selected shunt resistor voltage V5C.

2. The auto ranging ammeter of claim 1, further comprising: a measured charge output having a computed value as an integral of measured current outputs.

3. The auto ranging ammeter of claim 1, further comprising:
a voltmeter to measure a voltage supplied to a target device under test.

4. The auto ranging ammeter of claim 3, further comprising:
a measured power output having a computed value as the measured current output multiplied by the voltage supplied.

5. The auto ranging ammeter of claim 4, further comprising:
a measured energy output having a computed value as an integral of measured power outputs.

6. The auto ranging ammeter of claim 1, further comprising:
a current fusion block that disables each selection MOSFET and the shutoff MOSFET on an over-threshold condition.

7. The auto ranging ammeter of claim 6, wherein the over-threshold condition is one or more of a current threshold, a voltage threshold, a power threshold, an energy threshold, a charge threshold, and a duration.

8. The auto ranging ammeter of claim 1, wherein the amplified first shunt resistor voltage VOA is computed by combining a channel of two or more of the ADC, each provided by a gain stage with different gains.

9. The auto ranging ammeter of claim 1, further comprising:
a first analog low pass filter applied to the amplified first shunt resistor voltage VOA.

10. The auto ranging ammeter of claim 9, further comprising:
a second analog low pass filter applied to the amplified selected shunt resistor voltage V5A.

11. The auto ranging ammeter of claim 9, further comprising:
the least one second OPAMP configured to amplify the selected shunt resistor voltage V5 to into a second output V5B;
an additional ADC connected to the second output V5B of the at least one second OPAMP, the additional ADC providing a digitized unfiltered amplified shunt resistor voltage V5D, wherein the current output is calculated from the digitized first shunt resistor voltage VOC, the digitized selected shunt resistor voltage V5C, and the digitized unfiltered amplified shunt resistor voltage V5D.

12. The auto ranging ammeter of claim 1, further comprising:
an overflow detector configured to determine when the current output exceeds a signal range for a selected shunt resistor from the plurality of shunt resistors.

13. The auto ranging ammeter of claim 1, further comprising:
a field programmable gate array (FPGA) configured to automatically select a required selection MOSFET.

14. The auto ranging ammeter of claim 13, wherein the FPGA is configured to determine the current output from the digitized first shunt resistor voltage VOC and the digitized selected shunt resistor voltage V5C.

* * * * *